(12) United States Patent
Lee et al.

(10) Patent No.: US 8,946,758 B2
(45) Date of Patent: Feb. 3, 2015

(54) ORGANIC LIGHT EMITTING DISPLAY DEVICE AND METHOD OF MANUFACTURING ORGANIC LIGHT EMITTING DISPLAY DEVICE

(75) Inventors: Joon-Gu Lee, Yongin (KR); Won-Jong Kim, Yongin (KR); Ji-Young Choung, Yongin (KR); Jin-Baek Choi, Yongin (KR); Yeon-Hwa Lee, Yongin (KR); Young-Woo Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 386 days.

(21) Appl. No.: 13/431,723

(22) Filed: Mar. 27, 2012

(65) Prior Publication Data
US 2013/0001601 A1 Jan. 3, 2013

(30) Foreign Application Priority Data
Jun. 28, 2011 (KR) .................. 10-2011-0062871

(51) Int. Cl.
| | | |
|---|---|---|
| *H01L 33/00* | (2010.01) | |
| *H01L 21/00* | (2006.01) | |
| *H01L 51/52* | (2006.01) | |
| *H01L 33/38* | (2010.01) | |
| *H01L 33/60* | (2010.01) | |
| *H01L 33/40* | (2010.01) | |
| *H01L 27/32* | (2006.01) | |
| *H01L 33/42* | (2010.01) | |

(52) U.S. Cl.
CPC ............ *H01L 51/5203* (2013.01); *H01L 33/38* (2013.01); *H01L 33/60* (2013.01); *H01L 33/405* (2013.01); *H01L 51/5271* (2013.01); *H01L 27/3244* (2013.01); *H01L 33/42* (2013.01)

USPC .............. 257/99; 257/432; 257/436; 438/28; 438/29

(58) Field of Classification Search
CPC ............ H01L 51/5203; H01L 51/5012; H01L 51/5271; H01L 33/20; H01L 33/38; H01L 33/60; H01L 33/42; H01L 33/405; H01L 27/3244
See application file for complete search history.

(56) References Cited

U.S. PATENT DOCUMENTS

| | | | |
|---|---|---|---|
| 6,787,796 B2 * | 9/2004 | Do et al. .................. | 257/40 |
| 6,894,740 B2 | 5/2005 | Ohkawa | |
| 7,375,463 B2 | 5/2008 | Uemura et al. | |
| 7,573,193 B2 | 8/2009 | Okutani et al. | |
| 7,850,500 B2 * | 12/2010 | Park et al. ................ | 445/24 |
| 2006/0055319 A1 | 3/2006 | Uemura et al. | |
| 2006/0062270 A1 | 3/2006 | Okutani et al. | |

FOREIGN PATENT DOCUMENTS

| | | | |
|---|---|---|---|
| KR | 10-20030053443 A | 6/2003 | |
| KR | 10-20060027329 A | 3/2006 | |
| KR | 10-20060027330 A | 3/2006 | |

* cited by examiner

*Primary Examiner* — Alonzo Chambliss
(74) *Attorney, Agent, or Firm* — Christie, Parker & Hale, LLP

(57) ABSTRACT

An organic light emitting display device includes a substrate having a luminescent region and a non-luminescent region, an insulation layer on the substrate, a first electrode on the insulation layer, at least one light emitting structure on the first electrode, a second electrode on the light emitting structure, and at least one reflecting structure at one of the first electrode or the second electrode around the at least one light emitting structure. The reflecting structure may be configured to reflect light back toward the luminescent region.

23 Claims, 4 Drawing Sheets

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION

This application claims priority under 35 USC §119 to Korean Patent Application No. 2011-0062871, filed on Jun. 28, 2011 with the Korean Intellectual Property Office (KIPO), the contents of which are herein incorporated by reference in their entirety.

BACKGROUND

1. Field

Exemplary embodiments relate to organic light emitting display devices and methods of manufacturing organic light emitting display devices. More particularly, exemplary embodiments relate to organic light emitting display devices having reflecting structures and methods of manufacturing organic light emitting display devices having reflecting structures.

2. Description of Related Art

An organic light emitting diode (OLED) display device may have several advantages, such as a fast response times, relatively low power consumption, and wide viewing angles, regardless of its size. Additionally, the organic light emitting display device may be manufactured by simple processes executed at a relatively low temperature. Organic light emitting display devices are considered one of the most promising next-generation display devices.

In a conventional organic light emitting display device, an insulation layer may cover a thin film transistor provided on a substrate, and an anode, an organic light emitting layer, and a cathode may be sequentially disposed on the insulation layer. In a conventional organic light emitting display device, however, a considerable amount of the light generated from the organic light emitting layer may be reflected at an interface between the anode and an upper insulation layer. Further, the reflected light may be continuously reflected in the anode and may progress or be directed toward a non-luminescent region of the organic light emitting display device. Thus, significant amounts of light may not contribute to forming an image, so that light efficiency of the organic light emitting display device and luminance of images may be significantly deteriorated.

SUMMARY OF THE INVENTION

Exemplary embodiments of the present invention provide an organic light emitting display device having a reflecting structure, to provide an enhanced or improved light efficiency and an improved luminance.

Exemplary embodiments further provide a method of manufacturing an organic light emitting display device having a reflecting structure to provide an enhanced or improved light efficiency and an improved luminance.

According to an exemplary embodiment, there is provided an organic light emitting display device having a substrate having a luminescent region and a non-luminescent region, an insulation layer on the substrate, a first electrode on the insulation layer, at least one light emitting structure on the first electrode, a second electrode on the light emitting structure, and at least one reflecting structure at one of the first electrode or the second electrode around the at least one light emitting structure.

The reflecting structure may include a material having reflectivity.

The reflecting structure may be configured to reflect light generated from the light emitting structure and reflected at an interface between the first electrode and the insulation layer toward the non-luminescent region back toward the luminescent region.

The reflecting structure may include at least one of silver (Ag), platinum (Pt), chrome (Cr), tungsten (W), molybdenum (Mo), titanium (Ti), palladium (Pd), iridium (Ir), or alloys thereof.

The reflecting structure may have one of a circular ring shape, an elliptical ring shape, a track-shaped ring shape, or a polygonal ring shape.

A cross-sectional shape of the reflecting structure may be one of a truncated inverted-trapezoid shape, a truncated inverted-wedge shape, or a rounded shape toward the substrate.

A sidewall of the reflecting structure may have an angle of inclination in a range of about +20° to about +70° or in a range of about −20° to about −70° with respect to a direction parallel to the substrate.

A plurality of light emitting structures may be on the first electrode. A plurality of reflecting structures corresponding to the plurality of light emitting structures may be at the one of the first electrode or the second electrode.

A plurality of light emitting structures may be on the first electrode. At least one reflecting structure surrounding the plurality of light emitting structures may be at the one of the first electrode or the second electrode.

The reflecting structure may be buried in the one of the first electrode or the second electrode.

The reflecting structure may protrude from the one of the first electrode or the second electrode.

The organic light emitting display device may further include a switching device between the substrate and the insulation layer. The switching device may be electrically connected to the first electrode.

The first electrode may include a transparent conductive material and the second electrode may include a material having reflectivity. The reflecting structure may be at the first electrode.

The reflecting structure and the second electrode may include a same material.

The first electrode may include a material having reflectivity and the second electrode may include a transparent conductive material. The reflecting structure may be at the second electrode.

The reflecting structure and the first electrode may include a same material.

The organic light emitting display device may further include a protection layer on the second electrode. The reflecting structure may be configured to reflect light generated from the light emitting structure and reflected at an interface between the second electrode and the protection layer toward the non-luminescent region back toward the luminescent region.

According to another exemplary embodiment, there is provided a method of manufacturing an organic light emitting display device. In the method, an insulation layer may be formed on a substrate. A first electrode may be formed on the insulation layer. At least one reflecting structure may be formed at the first electrode. A pixel defining layer may be formed on the first electrode in which the pixel defining layer may define a luminescent region and a non-luminescent region. At least one light emitting structure may be formed on the first electrode in the luminescent region in which the at least one light emitting structure may be surrounded by the at least one reflecting structure. A second electrode may be formed on the at least one light emitting structure and the pixel defining layer.

In forming the reflecting structure, the first electrode adjacent to an area between the luminescent region and the non-luminescent region may be partially etched. The reflecting structure may be formed at the etched portion of the first electrode.

Partially etching the first electrode may include forming at least one opening that exposes the insulation layer.

The opening may have one of a circular ring shape, an elliptical ring shape, a track-shaped ring shape, or a polygonal ring shape. A cross-sectional shape of the opening may be one of a truncated inverted-trapezoid shape, a truncated inverted-wedge shape, or a rounded shape directed toward the substrate.

A sidewall of the opening may have an angle of inclination in a range of about +20° to about +70° or in a range of about −20° to about −70° with respect to a direction parallel to the substrate.

A plurality of light emitting structures may be formed on the first electrode. One reflecting structure surrounding the plurality of light emitting structures may be formed at the first electrode.

A plurality of light emitting structures may be formed on the first electrode. A plurality of reflecting structures may be formed at the first electrode, where the plurality of reflecting structures may respectively surround the plurality of light emitting structures.

According to yet another exemplary embodiment, there is provided a method of manufacturing an organic light emitting display device. In the method, an insulation layer may be formed on a substrate. A first electrode may be formed on the insulation layer. A pixel defining layer may be formed on the first electrode in which the pixel defining layer may define a luminescent region and a non-luminescent region. At least one light emitting structure may be formed on the first electrode in the luminescent region. A second electrode may be formed on the at least one light emitting structure and the pixel defining layer. At least one reflecting structure may be formed at the second electrode in which the reflecting structure may surround the at least one light emitting structure.

In forming the reflecting structure, at least one opening may be formed through the second electrode adjacent to an area between the luminescent region and the non-luminescent region. The reflecting structure may be formed in the at least one opening.

According to exemplary embodiments of the present invention, light may be generated from a light emitting structure and may be reflected at an interface between a first electrode and an upper insulation layer, or between a second electrode and a lower protection layer, toward a non-luminescent region. At least one reflecting structure positioned at one of the first electrode or the second electrode may reflect the light back toward a luminescent region of the organic light emitting display device, so that the organic light emitting display device having the reflecting structure may provide an enhanced light efficiency and improved luminance.

BRIEF DESCRIPTION OF THE DRAWINGS

Exemplary embodiments of the present invention will be more clearly understood from the following detailed description, taken in conjunction with the accompanying drawings.

FIG. 1 is a cross-sectional view illustrating an organic light emitting display device in accordance with an exemplary embodiment;

FIGS. 2 to 7 are cross-sectional views illustrating a method of manufacturing an organic light emitting display device in accordance with an exemplary embodiment;

FIG. 8 is a cross-sectional view illustrating an organic light emitting display device in accordance with another exemplary embodiment; and FIGS. 9 to 11 are cross-sectional views illustrating a method of manufacturing an organic light emitting display device in accordance with another exemplary embodiment.

DETAILED DESCRIPTION OF THE EMBODIMENTS

Figure 1:
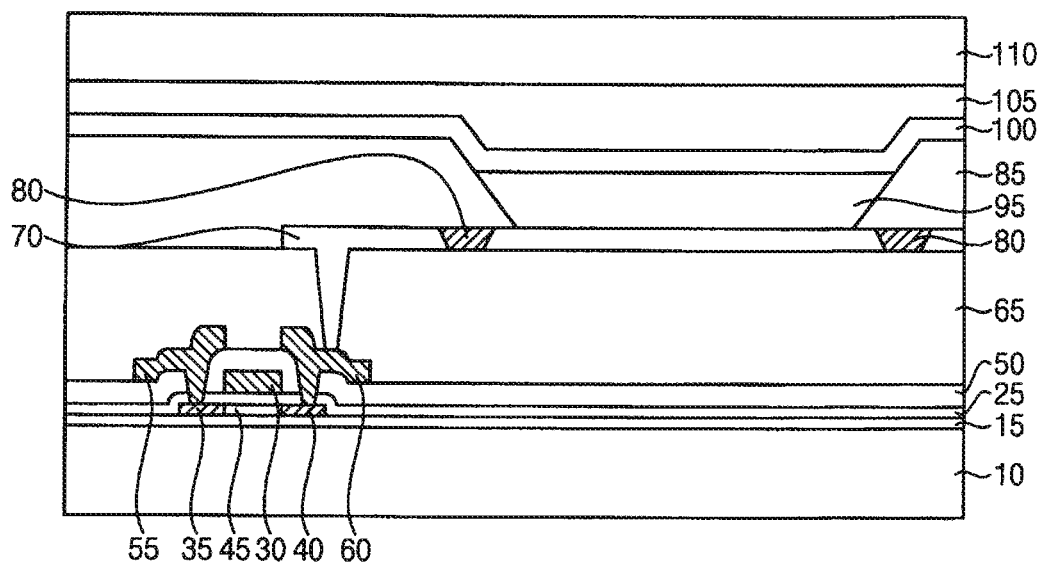
FIGS. 1 to 9 represent non-limiting, exemplary embodiments as described herein. In the drawings.

Various exemplary embodiments of the present invention will be described more fully hereinafter with reference to the accompanying drawings, in which some exemplary embodiments are shown. The invention may, however, be embodied in many different forms, and should not be construed as limited to the embodiments set forth herein. Rather, these embodiments are provided for this description to be thorough and complete, and will fully convey the scope of the invention to those skilled in the art. In the drawings, the sizes and relative sizes of layers and regions may be exaggerated for clarity.

It is to be understood that when an element or layer is referred to as being "on," "connected to," or "coupled to" another element or layer, the layer can be directly on, connected, or coupled to the other element, or one or more intervening elements or layers may also be present. In contrast, when an element is referred to as being "directly on," "directly connected to," or "directly coupled to" another element or layer, there will be no intervening elements or layers present. Like numerals refer to like elements throughout.

Spatially relative terms, such as "beneath," "below," "lower," "above," "upper" and the like, may be used herein for ease of description, to describe one element or feature's relationship to other element(s) or feature(s) as illustrated in the figures. It will be understood that these spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may also be otherwise oriented (e.g., rotated 90 degrees or at other orientations), and the spatially relative descriptors used herein may be interpreted accordingly.

Exemplary embodiments are described herein with reference to cross-sectional illustrations that are schematic illustrations (and intermediate structures). As such, variations from the shapes of the illustrations as a result of, for example, manufacturing techniques and/or tolerances, are to be expected. Thus, exemplary embodiments should not be construed as limited to the particular shapes of regions illustrated herein, but are to include deviations in shapes that result, for example, from manufacturing. Thus, the regions illustrated in the figures are schematic in nature and their shapes are not intended to limit the scope of example embodiments.

FIG. 1 is a cross-sectional view illustrating an organic light emitting display device including a reflecting structure in accordance with an exemplary embodiment of the present invention.

Referring to FIG. 1, the organic light emitting display device may include a first substrate 10, a switching device, an insulation layer 65, a first electrode 70, a reflecting structure 80, a pixel defining layer 85, a light emitting structure 95, a second electrode 100, a protection layer 105, and a second substrate 110, among other layers and/or components.

The first substrate 10 may include a transparent conductive material. For example, the first substrate 10 may include a glass substrate, a quartz substrate, a transparent plastic substrate, a transparent ceramic substrate, etc. When the first substrate 10 includes a transparent plastic substrate, the first substrate 10 may include polyimide-based resin, acryl-based resin, polyacrylate-based resin, polyether-based resin, polyethylene terephthalate (PET) resin, sulfonic acid resin, etc. These may be used alone or in various combinations thereof.

A buffer layer 15 may be provided on the first substrate 10. The buffer layer 15 may prevent or reduce a diffusion of metal atoms and/or impurities from reaching the first substrate 10. When the buffer layer 15 is included, velocity rate of heat transfer may be adjusted in a crystallization process for forming an active pattern, so that a more substantially uniform active pattern may be obtained. Further, when an upper face of the first substrate 10 is not level, the buffer layer 15 may enhance a flatness of the upper face of the first substrate 10.

The buffer layer 15 may include a silicon compound. For example, the buffer layer 15 may include silicon oxide (SiOx), silicon nitride (SiNx), silicon oxynitride (SiOxNy), silicon oxycarbide (SiOxCy), silicon carbonitride (SiCxNy), etc. These may be used alone or in various combinations thereof. Further, the buffer layer 15 may have a single layer structure or a multi layer structure. For example, the buffer layer 15 may have a single layer structure or a multi layer structure including a silicon oxide film, a silicon nitride film, a silicon oxynitride film, a silicon oxycarbide film and/or a silicon carbonitride film. In some embodiments, the buffer layer 15 may not be provided on the first substrate 10, depending on the composition and/or surface conditions of the first substrate 10.

A switching device may be on the buffer layer 15. The switching device may include a thin film transistor (TFT). In this case, the switching device may include an active pattern, a gate insulation layer 25, a gate electrode 30, an insulation interlayer 50, a source electrode 55, and a drain electrode 60, among other features. Here, the active pattern may include a source region 35, a drain region 40 and a channel region 45.

The active pattern may include silicon. For example, the active pattern may include polysilicon, polysilicon containing impurities, amorphous silicon, amorphous silicon containing impurities, partially crystallized silicon, silicon containing micro crystals, etc. Each of the source region 35 and the drain region 40 may include N type impurities or P type impurities according to a carrier conductive type of the thin film transistor. The channel region 45 may be defined by the source and the drain regions 35 and 40. For example, the source and the drain regions 35 and 40 may be positioned at lateral portions of the active pattern, respectively.

A gate insulation layer 25 may be positioned on the buffer layer 15 to cover the active pattern. The gate insulation layer 25 may have a uniform thickness on the buffer layer 15 along a profile of the buffer layer 15. In some embodiments, the gate insulation layer 25 may have a substantially level upper face while covering the active pattern. The gate insulation layer 25 may include silicon oxide, and/or metal oxide, etc. Examples of the metal oxide in the gate insulation layer 25 may include hafnium oxide (HfOx), aluminum oxide (AlOx), zirconium oxide (ZrOx), titanium oxide (TiOx), and tantalum oxide (TaOx), etc. These may be used alone or in various combinations thereof.

A gate electrode 30 may be on the gate insulation layer 25, under which the channel region 45 is located. The gate electrode 30 may include metal, alloy, metal nitride, conductive metal oxide, and/or a transparent conductive material, etc. For example, the gate electrode 30 may include aluminum (Al), alloy containing aluminum, aluminum nitride (AlNx), silver (Ag), alloy containing silver, copper (Cu), alloy containing copper, nickel (Ni), molybdenum (Mo), titanium (Ti), titanium nitride (TiNx), platinium (Pt), chrome (Cr), tantalum (Ta), tantalum nitride (TaNx), tungsten (W), tungsten nitride (WNx), neodymium (Nd), scandium (Sc), strontium ruthenium oxide (SrRuxOy), indium tin oxide (ITO), indium zinc oxide (IZO), zinc oxide (ZnOx), tin oxide (SnOx), indium oxide (InOx), gallium oxide (GaOx), etc. These may be used alone or in various combinations thereof. The gate electrode 30 may have a single layer structure including a metal film, an alloy film, a metal nitride film, a conductive metal oxide film or a transparent conductive material film. In some embodiments, the gate electrode 30 may have a multi layer structure including a metal film, an alloy film, a metal nitride film, a conductive metal oxide film and/or a transparent conductive material film.

Although it is not illustrated, a gate line coupled to the gate electrode 30 may be on a portion of the gate insulation layer 25. The gate line may extend on the gate insulation layer 25 along a first direction.

The insulation interlayer 50 may also be on the gate insulation layer 25 to cover the gate electrode 30. The insulation interlayer 50 may include a silicon compound. For example, the insulation interlayer 50 may have a single layer structure or a multi layer structure including a silicon oxide film, a silicon nitride film, a silicon oxynitride film, a silicon carbonitride film, and/or a silicon oxycarbide film. In some embodiments, the insulation interlayer 50 may have stepped portions due to profiles of the active pattern and the gate electrode 30. In this case, the insulation interlayer 50 may have a substantially uniform thickness. In some embodiments, the insulation interlayer 50 may have a substantially level upper face without a stepped portion.

A source electrode 55 and a drain electrode 60 of the switching device may be on a first portion and a second portion, respectively, of the insulation interlayer 50 around the gate electrode 30. Each of the source and the drain electrodes 55 and 60 may have a stepped portion or a substantially level upper face based on the structure of the insulation interlayer 50. The source electrode 55 and the drain electrode 60 may be connected to the source region 35 and the drain region 40, respectively, through the insulation interlayer 50. Each of the source and the drain electrodes 55 and 60 may include metal, alloy, metal nitride, conductive metal oxide, and/or a transparent conductive material, etc. For example, the source and the drain electrodes 55 and 60 may include aluminum, alloy containing aluminum, aluminum nitride, silver, alloy containing silver, copper, alloy containing copper, nickel, molybdenum, titanium, titanium nitride, platinium, chrome, tantalum, tantalum nitride, tungsten, tungsten nitride, neodymium, scandium, strontium ruthenium oxide, indium tin oxide, indium zinc oxide, zinc oxide, tin oxide, indium oxide, gallium oxide, etc. These may be used alone or in various combinations thereof. In some embodiments, each of the source and the drain electrodes 55 and 60 may have a single layer structure or a multi layer structure including a metal film, an alloy film, a metal nitride film, a conductive metal oxide film, and/or a transparent conductive material film.

Although it is not illustrated, a data line coupled to the source electrode 55 may also be on the insulation interlayer 50. The data line may extend on the insulation interlayer 50 along a second direction. Here, the second direction may be substantially perpendicular to the first direction in which a gate line extends.

An insulation layer 65 may be on the insulation interlayer 50 to cover the switching device. The insulation layer 65 may have a substantially level upper face. In some embodiments, the insulation layer 65 may include a material having self-planarizing properties. Alternatively, a planarization process may be performed on the insulation layer 65. For example, the insulation layer 65 may include photoresist, acryl-based polymer, polyimide-based polymer, polyamide-based polymer, siloxane-based polymer, polymer containing photosensitive acryl carboxyl, novolak resin, alkali developable resin, silicon oxide, silicon nitride, silicon oxynitride, silicon oxycarbide, silicon carbonitride, aluminum, magnesium, zinc, hafnium, zirconium, titanium, tantalum, aluminum oxide, and/or titanium oxide, tantalum oxide, magnesium oxide, zinc oxide, hafnium oxide, zirconium oxide, titanium oxide, etc. These may be used alone or in various combinations thereof.

A first electrode 70 may be positioned on the insulation layer 65. The first electrode 70 may contact the drain electrode 60 through the insulation layer 65. The first electrode 70 may extend along a portion of the insulation layer 65. In some embodiments, a contact structure or a pad structure may be provided on the drain electrode 60 through the insulation layer 65. In this case, the first electrode 70 may be electrically connected to the drain electrode 60 through such contact structure or pad structure.

When the organic light emitting display device has a bottom emission type, the first electrode 70 may include a transparent conductive material. For example, the first electrode 70 may include strontium ruthenium oxide, zinc oxide, indium tin oxide, indium zinc oxide, tin oxide, indium oxide, and/or gallium oxide, etc. These may be used alone or in various combinations thereof. Further, the first electrode 70 may have a single layer structure or a multi layer structure including at least one transparent conductive material film.

When the first electrode 70 includes the transparent conductive material, the reflecting structure 80 may be disposed at the first electrode 70. In some embodiments, the reflecting structure 80 may be adjacent to a light emitting structure 95. In this case, the reflecting structure 80 may be completely or partially buried in the first electrode 70. For example, the reflecting structure 80 may buried in a trench, a recess, a groove, a dent, or similar structure provided on the first electrode 70. That is, an upper face of the reflecting structure 80 and an upper face of the first electrode 70 may be located on substantially the same plane. Alternatively, the reflecting structure 80 may substantially protrude from an upper face of the first electrode 70.

In example embodiments, the reflecting structure 80 may enclose a lower portion of the light emitting structure 95. For example, the reflecting structure 80 may have various planar shapes such as a substantially circular ring shape, a substantially elliptical ring shape, a substantially track-shaped ring shape, a substantially tetragonal ring shape, a substantially hexagonal ring shape, or a substantially polygonal ring shape, etc. Further, an upper portion of the reflecting structure 80 may have a width substantially larger than a width of a lower portion thereof. For example, the reflecting structure 80 may have various cross-sectional shapes such as a substantially truncated inverted-trapezoid shape, a substantially truncated inverted-wedge shape, etc. Thus, a sidewall of the reflecting structure 80 may have a predetermined angle of inclination, so that the reflecting structure 80 may substantially entirely reflect incident light. Here, the light may be incident onto the reflecting structure 80 after passing through the first electrode 70.

In some embodiments, when the first electrode 70 includes the transparent conductive material, a plurality of light emitting structures 95 may be arranged at the first electrode 70. In this case, one reflecting structure 80 or more than one reflecting structure 80 may be at or in the first electrode 70. For example, a plurality of reflecting structures 80 may substantially surround lower portions of the plurality of light emitting structures 95, respectively. Alternatively, one reflecting structure 80 may entirely enclose lower portions of the plurality of light emitting structures 95.

In some embodiments, light generated from the light emitting structure 95 may pass through the first electrode 70 in a direction substantially parallel to the first substrate 10 and may travel toward a non-luminescent region of the organic light emitting display device. Here, the reflecting structure 80 may reflect the light toward the first substrate 10 in the luminescent region, thereby enhancing a light efficiency of the organic light emitting display device. In this case, a sidewall of the reflecting structure 80 may have an angle of inclination in a range of about +20° to about +70° or in a range of about −20° to about −70° with respect to a direction substantially parallel to the first substrate 10 and/or the first electrode 70.

When the first electrode 70 includes a transparent conductive material, the reflecting structure 80 may include a material having a relatively high reflectivity. For example, the reflecting structure 80 may include metal such as aluminum (Al), silver (Ag), molybdenum (Mo), titanium (Ti), gold (Au), platinium (Pt), chrome (Cr), tungsten (W), palladium (Pd), iridium (Ir), and/or alloys of these metals, etc. These may be used alone or in various combinations thereof. Further, the reflecting structure 80 may have a single layer structure or a multi layer structure including a metal film and/or an alloy film.

In conventional organic light emitting display devices, light emitted from an organic light emitting layer is reflected from an interface between a transparent electrode and a lower insulation layer with a reflection level or amount of about 46.9%. The reflected light may be continuously reflected in the transparent electrode, and then may progress toward a non-luminescent region of the conventional organic light emitting display device, so that light efficiency of the conventional organic light emitting display device may be significantly reduced. However, according to embodiments of the present invention, the reflecting structure 80 may be arranged between the luminescent region and the non-luminescent region of the organic light emitting display device when the first electrode 70 includes the transparent conductive material, such that the reflecting structure 80 may reflect more light in the first electrode 70 toward the first substrate 10 in the luminescent region. Hence, light efficiency and luminance of the organic light emitting display device may be enhanced, thereby improving image quality of the organic light emitting display device.

A pixel defining layer 85 may have an opening that partially exposes the first electrode 70. The pixel defining layer 85 may be on the reflecting structure 80, the first electrode 70 and the insulation layer 65. The pixel defining layer 85 may include an organic material and/or an inorganic material. For example, the pixel defining layer 85 may include photoresist, polyacrylate-based resin, polyimide-based resin, acryl-based resin, and/or silicon oxide, etc. The pixel defining layer 85 may define a luminescent region and a non-luminescent region of the organic light emitting display device. For example, a region of the pixel defining layer 85 in which the opening of the pixel defining layer 85 is located may correspond to the luminescent region and a region of the pixel defining layer 85 adjacent to the opening may correspond to the non-luminescent region. Here, the reflecting structure 80 may be positioned at or around a boundary between the luminescent region and the non-luminescent region. In some embodiments, a sidewall of the opening may have an angle of inclination in a range of about 110° to about 160° with respect to an axis substantially parallel to the first substrate 10.

The light emitting structure 95 may be on a portion of the first electrode 70 exposed by the pixel defining layer 85. A lower portion of the light emitting structure 95 may make contact with the first electrode 70, and a lateral or side portion of the light emitting structure 95 may make contact with the pixel defining layer 85. Therefore, the lateral portion of the light emitting structure 95 may also have an angle of inclination in a range of about 110° to about 160° relative to an axis substantially parallel to the first substrate 10. In example embodiments, the light emitting structure 95 may have a multi layer structure including an organic light emitting layer (EL), a hole injection layer (HIL), a hole transport layer (HTL), an electron transport layer (ETL), and/or an electron injection layer (EL), etc. The light emitting structure 95 may include an organic material for generating a red color light, a green color light, or a blue color light, according to pixels of the organic light emitting display device. In some embodiments, the light emitting structure 95 may include a plurality of laminated light emitting material layers generating different colors of light to thereby generate, for example, a white color light.

A second electrode 100 may be on the light emitting structure 95 and the pixel defining layer 85. The second electrode 100 may extend from the luminescent region to the non-luminescent region. The second electrode 100 may have a uniform thickness on the light emitting structure 95 and the pixel defining layer 85. When the organic light emitting display device has a bottom emission type, the second electrode 100 may include a material having reflectivity. For example, the second electrode 100 may include aluminum, silver, platinium, gold, chrome, tungsten, molybdenum, titanium, palladium, iridium, alloys of these metals, etc. These may be used alone or in various combinations thereof. In this case, the reflecting structure 80 may include a material substantially the same as or substantially similar to material(s) of the second electrode 100. The second electrode 100 may have a single layer structure or a multi layer structure including a metal film and/or an alloy film.

In some embodiments, when the organic light emitting display device has a top emission type, the first electrode 70 may include a material having a reflectivity whereas the second electrode 100 may include a transparent conductive material. In this case, at least one reflecting structure 80 may be disposed at the second electrode 100 between the luminescent region and the non-luminescent region. Additionally, the reflecting structure 80 may include a material substantially the same as or substantially similar to material(s) of the first electrode 70.

When the second electrode 100 includes the transparent conductive material, the reflecting structure 80 may be arranged in the second electrode 100 adjacent to the light emitting structure 95. For example, the reflecting structure 80 may surround an upper portion of the light emitting layer 95. Further, the reflecting structure 80 may be completely or partially buried in the second electrode 100. For example, the reflecting structure 80 may be buried in a trench, a recess, a groove, a dent or other similar structure provided on the second electrode 100. That is, an upper face of the reflecting structure 80 and an upper face of the second electrode 100 may be located on the substantially same plane in these embodiments. Alternatively, the reflecting structure 80 may substantially protrude from the upper face of the second electrode 100.

When the organic light emitting display device has a top emission type, a lateral portion of the reflecting structure 80 may have a predetermined angle of inclination, so that the reflecting structure 80 may substantially totally reflect incident light. Here, the light may be incident onto the reflecting structure 80 along a direction substantially parallel to the first substrate 10 after the light progresses through the second electrode 100. That is, the light generated from the light emitting structure 95 may pass through the second electrode 100 in a direction substantially parallel to the first substrate 10 and may progress toward non-luminescent regions of the organic light emitting display device. Here, the reflecting structure 80 may reflect more light away from the first substrate 10 in the luminescent region, thereby enhancing the light efficiency of the organic light emitting display device. For example, a sidewall of the reflecting structure 80 at the second electrode 100 may have an angle of inclination in a range of about +20° to about +70° or in a range of about −20° to about −70° with respect to a direction substantially parallel to the first substrate 10.

In some embodiments, when the second electrode 100 includes the transparent conductive material, a plurality of the light emitting structures 95 may be disposed on the first electrode 70. In this case, one or more reflecting structures 80 may be disposed at or in the second electrode 100. For example, a plurality of reflecting structures 80 may be positioned at the second electrode 100 to substantially surround upper portions of a plurality of light emitting structures 95, respectively. Alternatively, one reflecting structure 80 may be located at the second electrode 100 to substantially enclose the upper portions of the plurality of light emitting structures 95.

A protection layer 105 may be disposed on the second electrode 100. The protection layer 105 may extend from the luminescent region to the non-luminescent region. The protection layer 105 may include an organic material and/or an inorganic material. For example, the protection layer 105 may include photoresist, polyamide-based polymer, polyimide-based polymer, acryl-based polymer, siloxane-based polymer, polymer containing photosensitive acryl carboxyl, novolak resin, alkali developable resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and/or titanium oxide, etc. These may be used alone or in various combinations thereof. Further, the protection layer 105 may have a single layer structure or a multi layer structure including an organic material film and/or an inorganic material film.

In some embodiments, when the reflecting structure 80 is buried in the second electrode 100, the reflecting structure 80 may reflect incident light back toward the luminescent region where the light generated from the light emitting structure 95 may otherwise be partially reflected at an interface between the second electrode 100 and the protection layer 105 toward the non-luminescent region. Thus, light efficiency and luminance of the organic light emitting display device may be enhanced.

A second substrate 110 may be provided on the protection layer 105. The second electrode 110 may include a glass substrate, a quartz substrate, a transparent plastic substrate, and/or a transparent ceramic substrate, etc. In some embodiments, a space may be provided between the protection layer 105 and the second electrode 100, or between the protection layer 105 and the second substrate 110 in the luminescent region. In this case, the space may be filled with air, an inert gas such as nitrogen, etc. Alternatively, the space may be filled with resin having light transmittance and hygroscopicity.

FIGS. 2 to 7 are cross-sectional views illustrating a method of manufacturing an organic light emitting display device in accordance with embodiments of the present invention. The organic light emitting display device manufactured by the method illustrated in FIGS. 2 to 7 may have a construction substantially the same as or substantially similar to that of the organic light emitting display device described with reference to FIG. 1.

Figure 2:
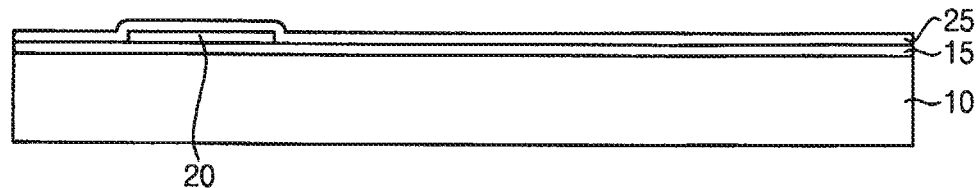

Referring to FIG. 2, a buffer layer 15 may be formed on a first substrate 10. The first substrate 10 may include a transparent insulation material. In some embodiments, the buffer layer 15 may be formed on the first substrate 10 after performing a planarization process on the first substrate 10. For example, an upper face of the first substrate 10 may be substantially planarized by a chemical mechanical polishing (CMP) process and/or an etch-back process. In some embodiments, the buffer layer 15 may not be formed on the first substrate 10 in accordance with a surface flatness or a composition of the first substrate 10.

The buffer layer 15 may be formed using a silicon compound. For example the buffer layer 15 may be formed using silicon oxide, silicon nitride, silicon oxynitride, silicon oxycarbide, and/or silicon carbonitride, etc. These may be used alone or in various combinations thereof. Further, the buffer layer 15 may be formed on the first substrate 10 by performing a chemical vapor deposition (CVD) process, a thermal oxidation process, a plasma enhanced chemical vapor deposition (PECVD) process, a high density plasma-chemical vapor deposition (HDP-CVD) process, or a spin coating process, etc.

A semiconductor layer 20 may be formed on the buffer layer 15. The semiconductor layer 20 may be formed by a CVD process, a PECVD process, a low pressure CVD process, or a sputtering process, etc. The semiconductor layer 20 may include polysilicon, polysilicon containing impurities, amorphous silicon, amorphous and/or silicon containing impurities, partially crystallized silicon, silicon containing micro crystals, etc. In some embodiments, a preliminary semiconductor layer (not illustrated) may be formed on the buffer layer 15 first, and then the semiconductor layer 20 may be obtained by crystallizing the preliminary semiconductor layer. In some embodiments, a crystallization process may be carried out after forming a gate insulation layer 25 on the buffer layer 15 or after forming a gate electrode 30 on the gate insulation layer 25. Here, the semiconductor layer 20 may be obtained by a laser irradiation process, a heat treatment process, or a heat treatment process using a catalyst, etc.

In some example embodiments, after forming the semiconductor layer 20 and/or the preliminary semiconductor layer, a dehydrogenation process may be performed about the semiconductor layer 20 and/or the preliminary semiconductor layer. Thus, a concentration of hydrogen atoms in the semiconductor layer 20 may be reduced so that electrical characteristics of the semiconductor layer 20 may be enhanced.

Referring now to FIG. 2, a gate insulation layer 25 may be formed on the buffer layer 15 to cover the semiconductor layer 20. The gate insulation layer 25 may be formed by a CVD process, a PECVD process, an HDP-CVD process, a spin coating process, a sputtering process, a printing process, or a vacuum evaporation process, etc. Further, the gate insulation layer 25 may be formed using silicon oxide, and/or metal oxide, etc. Examples of metal oxide in the gate insulation layer 25 may include hafnium oxide, aluminum oxide, zirconium oxide, titanium oxide, and/or tantalum oxide, etc. These may be used alone or in various combinations thereof. The gate insulation layer 25 may be formed on the buffer layer 15, and thus stepped portions of the gate insulation layer 25 may be generated adjacent to the semiconductor layer 20. In some embodiments, the gate insulation layer 25 may have a substantially level upper face to sufficiently cover the semiconductor layer 20.

Figure 3:
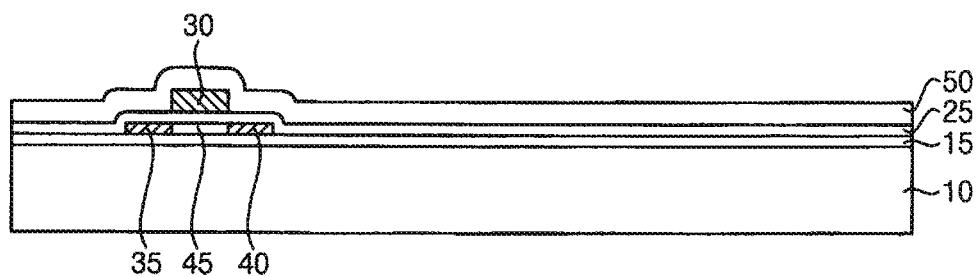

Referring to FIG. 3, a gate electrode 30 may be formed on the gate insulation layer 25. The gate electrode 30 may be formed on a portion of gate insulation layer 25 under which the semiconductor layer 20 is located. In example embodiments, after forming a first conductive layer (not illustrated) on the gate insulation layer 25, the gate electrode 30 may be formed by patterning the first conductive layer. Here, the first conductive layer may be formed by a CVD process, a sputtering process, a vacuum evaporation process, a pulsed laser deposition (PLD) process, or an atomic layer deposition (ALD) process, etc. Additionally, the gate electrode 30 may be formed using metal, alloy, metal nitride, conductive metal oxide, and/or a transparent conductive material, etc. For example, the gate electrode 30 may be formed using aluminum, alloy containing aluminum, aluminum nitride, silver, alloy containing silver, copper, alloy containing copper, nickel, molybdenum, titanium, titanium nitride, platinium, chrome, tantalum, tantalum nitride, tungsten, tungsten nitride, neodymium, scandium, strontium ruthenium oxide, indium tin oxide, indium zinc oxide, zinc oxide, tin oxide, indium oxide, and/or gallium oxide, etc. These may be used alone or in various combinations thereof.

Although it is not illustrated, a gate line may be formed on a portion of the gate insulation layer 25. The gate line may be connected to the gate electrode 30. The gate line may extend on the gate insulation layer 25 along a first direction.

A source region 35 and a drain region 40 may be formed at the semiconductor layer 20 by implanting impurities into lateral portions of the semiconductor layer 30 using the gate electrode 30 as a mask. Therefore, an active pattern including the source region 35, the drain region 40 and a channel region 45 may be provided on the buffer layer 15. In this case, the impurities may not be doped into a central portion of the semiconductor layer 20 located under the gate electrode 30, and thus the central portion of the semiconductor layer 20 may become the channel region 45 between the source region 35 and the drain region 40. For example, the channel region 45 may be defined as the source and the drain regions 35 and 40 are formed.

An insulation interlayer 50 may be formed on the gate insulation layer 25 to cover the gate electrode 30. The insulation interlayer 50 may be formed on the gate insulation layer 25 along a profile of the gate electrode 30. Thus, the insulation interlayer 50 may have stepped portions adjacent to the gate electrode 30. The insulation interlayer 50 may be formed using a silicon compound. For example, the insulation interlayer 50 may be formed using silicon oxide, silicon nitride, silicon oxynitride, silicon carbonitride, and/or silicon oxycarbide, etc. These may be used alone or in various combinations thereof. Additionally, the insulation interlayer 50 may be obtained by a spin coating process, a CVD process, a PECVD process, or an HDP-CVD process, etc.

Figure 4:
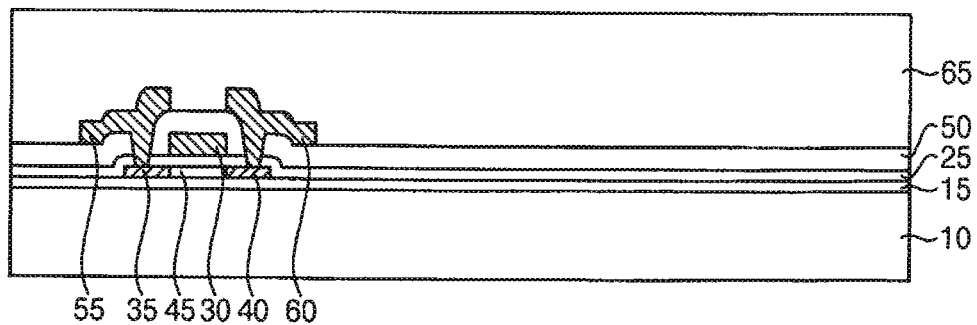

Referring to FIG. 4, a source electrode 55 and a drain electrode 60 may be formed on the insulation interlayer 50. The source and drain electrodes 55 and 60 may be substantially symmetrically positioned on the insulation interlayer 50 centering the gate electrode 30. Here, the source electrode 55 may extend from a first portion of the insulation interlayer 50 over the source region 35 to a second portion of the insulation interlayer 50 on the gate electrode 30. Similarly, the drain electrode 60 may extend from a third portion of the insulation interlayer 50 over the drain region 40 to the second portion of the insulation interlayer 50 on the gate electrode 30. The source electrode 55 and the drain electrode 60 may pass through the insulation interlayer 50 to make contact with the source region 35 and the drain region 40, respectively.

In some embodiments, after forming holes exposing the source and the drain regions 35 and 40 by partially etching the insulation interlayer 50, a second conductive layer (not illustrated) may be formed on the insulation interlayer 50 to substantially fill the holes. Then, the source electrode 55 and the drain electrode 60 may be obtained by patterning the second conductive layer. Here, the second conductive layer may be formed by a CVD process, a sputtering process, a vacuum evaporation process, a PLD process, an ALD process, or a printing process, etc. Each of the source and drain electrodes 55 and 60 may be formed using metal, alloy, metal nitride, conductive metal oxide, and/or a transparent conductive material etc. For example, each of the source and drain electrodes 55 and 60 may be formed using aluminum, alloy containing aluminum, aluminum nitride, silver, alloy containing silver, copper, alloy containing copper, nickel, molybdenum, titanium, titanium nitride, platinum, chrome, tantalum, tantalum nitride, tungsten, tungsten nitride, neodymium, scandium, strontium ruthenium oxide, indium tin oxide, indium zinc oxide, zinc oxide, tin oxide, indium oxide, and/or gallium oxide, etc. These may be used alone or in various combinations thereof.

Although it is not illustrated, a data line may be formed on a portion of the insulation interlayer 50. The data line may be connected to the source electrode 55. The data line may extend on the insulation interlayer 50 along a second direction. Here, the second direction may be substantially perpendicular to a first direction in which the gate line extends.

As the source and drain electrodes 55 and 60 are formed, a thin film transistor including the active pattern, the gate insulation layer 25, the gate electrode 30, the source electrode 55, and the drain electrode 60 may be provided on the first substrate 10. Here, the thin film transistor may serve as a switching device of the organic light emitting display device.

An insulation layer 65 may be formed on the insulation interlayer 50 to cover the source and drain electrodes 55 and 60. The insulation layer 65 may have a relatively large thickness to completely cover the source and drain electrodes 55 and 60. Additionally, the insulation layer 65 may have a substantially level upper face. In some embodiments, the insulation layer 65 may be formed using a material having self-planarizing properties. In some embodiments, an upper face of the insulation layer 65 may be substantially planarized by a CMP process and/or an etch-back process.

The insulation layer 65 may be formed using an organic material and/or an inorganic material. For example, the insulation layer 65 may be formed using photoresist, polyamide-based polymer, polyimide-based polymer, acryl-based polymer, siloxane-based polymer, polymer containing photosensitive acryl carboxyl, novolak resin, alkali developable resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and/or titaniumoxide, etc. These may be used alone or in various combinations thereof. Further, the insulation layer 65 may be formed by a CVD process, a PECVD process, an HDP-CVD process, an ALD process, a spin coating process, a sputtering process, a printing process, or a vacuum evaporation process, etc. In some embodiments, after forming a lower protection layer (not illustrated) covering the switching device on the insulation interlayer 50, the insulation layer 65 may be formed on the lower protection layer.

Figure 5:
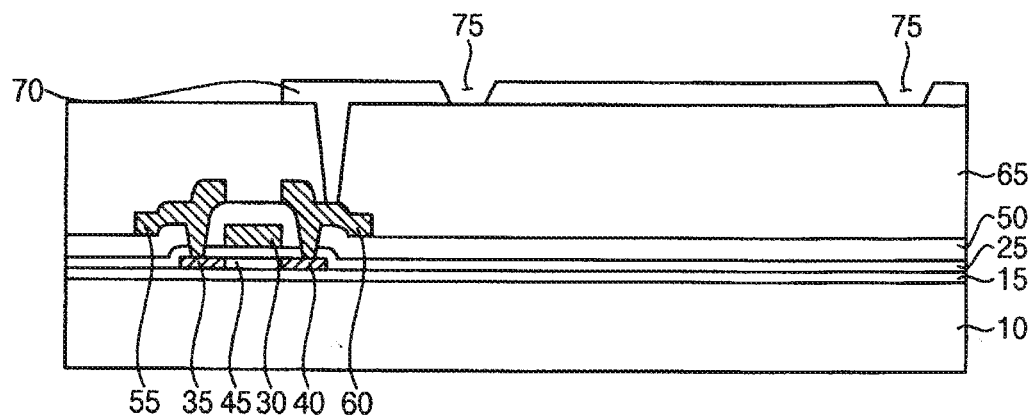

Referring to FIG. 5, after forming a hole through the insulation layer 65 to expose the drain electrode 60, a first electrode 70 may be formed on the insulation layer 65 to fill the hole. The first electrode 70 may make contact with the drain electrode 60, and may extend from a non-luminescent region to a luminescent region of the organic light emitting display device. In some embodiments, after forming a first electrode layer (not illustrated) on the insulation layer 65 to fill the hole of the insulation layer 65, the first electrode 70 may be formed from a portion of the non-luminescent region to the luminescent region by patterning the first electrode layer. In this case, the first electrode layer may be formed by a CVD process, a sputtering process, or a vacuum evaporation process, a PLD process, an ALD process, a spin coating process, a printing process, etc. In some embodiments, after forming a contact structure or a pad structure in the hole of the insulation layer 65 to make contact with the drain electrode 60, the first electrode 70 may be formed on the contact structure or the pad structure, and on the insulation layer 65. Here, the first electrode 70 may be electrically connected to the drain electrode 60 through such a contact structure or pad structure.

When the organic light emitting display device has a bottom emission type, the first electrode 70 may be formed using a transparent conductive material. For example, the first electrode 70 may be formed using indium tin oxide, indium zinc oxide, tin zinc oxide, zinc oxide, tin oxide, indium oxide, and/or gallium oxide, etc. These may be used alone or in various combinations thereof.

Referring now to FIG. 5, a trench, a groove, or other opening 75 may be formed on the first electrode 70 to partially expose the insulation layer 65 by partially etching the first electrode 70. Here, the trench, the groove, or other opening 75 may have a substantially ring shape and may be obtained by a dry etching process. The opening 75 of the first electrode 70 may substantially surround the luminescent region. For example, the opening 75 of the first electrode 70 may have a substantially circular ring shape, a substantially elliptical ring shape, a substantially track-shaped ring shape, a substantially polygonal ring shape, etc. However, the opening 75 may substantially surround the luminescent region, such that a shape of the opening 75 may vary in accordance with a structure of the luminescent region and/or a shape of a light emitting structure 95 formed later. Further, a lower portion of the opening 75 of the first electrode 70 may have a width substantially smaller than a width of an upper portion of the opening 75. For example, the opening 75 may have various cross-sectional shapes such as a substantially truncated inverted-trapezoid shape, a substantially truncated inverted-wedge shape, etc. Therefore, a sidewall of the opening 75 may have an angle of inclination in a range of about +20° to about +70° or in a range of about −20° to about −70° relative to a direction substantially parallel to the first substrate 10. In some embodiments, a trench, a recess, a dent, or other similar structure may be formed on a portion of the first electrode 70 instead of the opening 75, without exposing the insulation layer 65.

Figure 6:
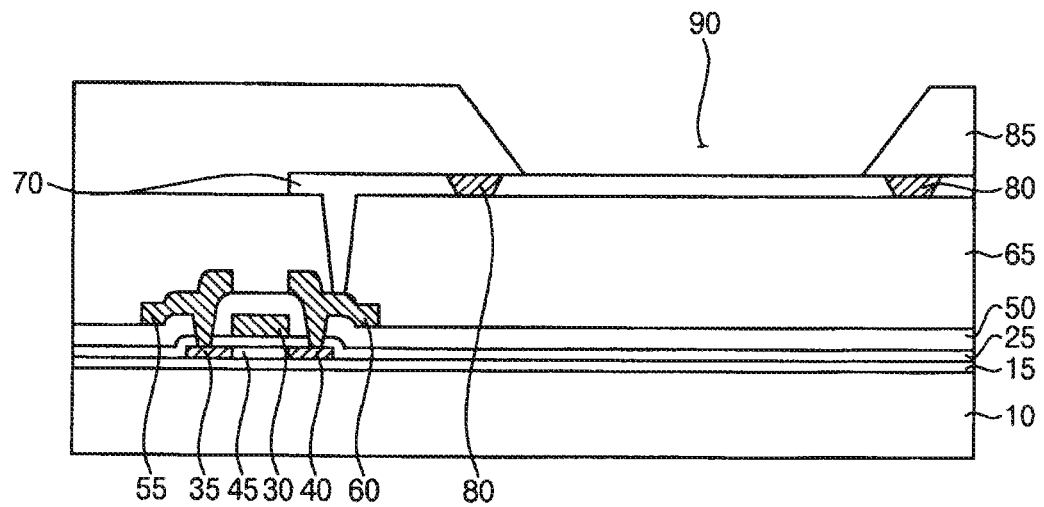

Referring to FIG. 6, a reflecting structure 80 may be formed in the opening 75 of the first electrode 70. In some embodiments, the reflecting structure 80 may have a planar shape and a cross-sectional shape substantially the same as or substantially similar to that of the opening 75 of the first electrode 70. Additionally, a sidewall of the reflecting structure 80 may have an angle of inclination in a range of about +20° to about +70° or in a range of about −20° to about −70° with respect to a direction substantially parallel to the first substrate 10. When the first electrode 70 includes the transparent conductive material, the reflecting structure 80 may include a material having reflectivity. For example, the reflecting structure 80 may be formed using aluminum, silver, platinium, gold, chrome, tungsten, molybdenum, titanium, palladium, iridium, and/or alloys of these metals, etc. These may be used alone or in various combinations thereof. Further, the reflecting structure 80 may be formed by a CVD process, a sputtering process, a vacuum evaporation process, a PLD process, an ALD process, or a printing process, etc.

In some embodiments, a pixel defining layer 85 may be formed on the insulation layer 65, the reflecting structure 80, and the first electrode 70, and then a pixel opening 90 may be formed to expose the first electrode 70 by partially etching the pixel defining layer 85. A luminescent region of the organic light emitting display device may be defined according to the pixel opening 90 of the pixel defining layer 85. That is, a portion of the pixel defining layer 85 having the pixel opening 90 may substantially correspond to a luminescent region, and other portions of the pixel defining layer 85 may substantially correspond to a non-luminescent region. The pixel defining layer 85 may be formed using an organic material and/or an inorganic material. For example, the pixel defining layer 85 may be formed using photoresist, polyacrylate-based resin, polyimide-based resin, acryl-based resin, and/or a silicon compound.

In some embodiments, the pixel defining layer 85 may be formed on the first electrode 70 without exposing the reflecting structure 80. For example, the reflecting structure 80 may be positioned adjacent to the pixel opening 90 of the pixel defining layer 85. A lower portion of the pixel opening 90 of the pixel defining layer 85 may have a width substantially smaller than that of an upper portion of the pixel opening 90. Thus, the pixel opening 90 of the pixel defining layer 85 may have a substantially inclined sidewall. For example, the pixel opening 90 of the pixel defining layer 85 may have an angle of inclination in a range of about 110° to about 160° relative to a direction substantially parallel to the first substrate 10.

In some embodiments, at least one pixel opening 90 may be formed through the pixel defining layer 85. In some embodiments, a plurality of pixel openings 90 may be formed to expose portions of the first electrode 70, respectively. In this case, a plurality of reflecting structures 80 respectively adjacent to the plurality of pixel openings 90 of the pixel defining layer 85 may be disposed at or formed in the first electrode 70. Alternatively, one reflecting structure 80 may be formed to substantially enclose the plurality of pixel openings 90.

Figure 7:
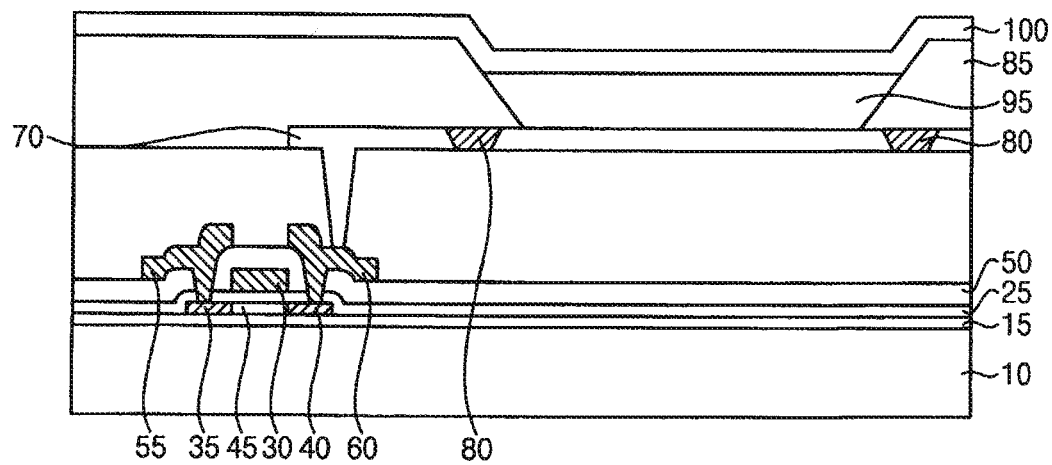

Referring to FIG. 7, a light emitting structure 95 may be formed on a portion of the first electrode 70 exposed by the pixel opening 90 of the pixel defining layer 85. In some embodiments, the light emitting structure 95 may have a multi layer structure including an organic light emitting layer (EL), a hole injection layer (HIL), a hole transport layer (HTL), an electron transport layer (ETL), and/or an electron injection layer (EIL), etc. The light emitting structure 95 may be formed using a light emitting material for generating a red color light, a green color light, or a blue color light, in accordance with a pixel of the organic light emitting display device. In some embodiments, the light emitting structure 95 may include a plurality of light emitting material layers for generating different colors of light to thereby generate, for example, a white color light.

The light emitting structure 95 may make contact with the first electrode 70 and the pixel defining layer 85 in the luminescent region. For example, a lower face of the light emitting structure 95 may make contact with the first electrode 70, and a sidewall of the light emitting structure 95 may contact the pixel defining layer 85. Thus, the sidewall of the light emitting structure 95 may have an angle of inclination substantially the same as or substantially similar to that of the pixel opening 90 of the pixel defining layer 85. For example, the sidewall of the light emitting layer 95 may have an angle of inclination in a range of about 110° to about 160° with respect to an axis substantially parallel to the first substrate 10.

In some embodiments, when one pixel opening 90 is formed through the pixel defining layer 85, one light emitting structure 95 may be formed on the first electrode 70 and one reflecting structure 80 may be formed at or in the first electrode 70. In some embodiments, a plurality of pixel openings 90 may be formed through the pixel defining layer 85, and thus a plurality of light emitting structures 95 may be formed in the plurality of pixel openings 90. Additionally, a plurality of reflecting structures 80 respectively surrounding the plurality of light emitting structures 95, or one reflecting structure 80 entirely surrounding the plurality of light emitting structures 95, may be formed at or in the first electrode 70.

As illustrated in FIG. 7, a second electrode 100 may be formed on the light emitting structure 95 and the pixel defining layer 85. The second electrode 100 may extend from the luminescent region to the non-luminescent region. The second electrode 100 may have a substantially uniform thickness. When the organic light emitting display device has a bottom emission type, the second electrode 100 may be formed using a material having reflectivity. For example, the second electrode 100 may be formed using indium tin oxide, indium zinc oxide, zinc tin oxide, zinc oxide, tin oxide, indium oxide, and/or gallium oxide, etc. These may be used alone or in various combinations thereof. In some embodiments, the second electrode 100 may be formed using a material substantially the same as or substantially similar to material(s) of the reflecting structure 80. Alternatively, the second electrode 100 may be formed using a material different from that of the reflecting structure 80. A sidewall of the second electrode 100 may also have a predetermined angle of inclination in the luminescent region according to an inclination angle of the sidewall of the pixel opening 90. For example, the sidewall of the second electrode 100 may have an angle of inclination in a range of about 110° to about 160° with respect to a direction substantially parallel to the first substrate 10.

When the organic light emitting display device has a top emission type, the second electrode 100 may include a transparent conductive material, and the first electrode 70 may include a material having reflectivity. Here, at least one additional opening (not illustrated) may be formed at the second electrode 100, and a reflecting structure 80 may be completely or partially buried in the additional opening of the second electrode 100. For example, the reflecting structure 80 may be formed at the second electrode 100 located between the luminescent region and the non-luminescent region. Thus, the reflecting structure 80 may reflect incident light toward the luminescent region where the light generated from the light emitting structure 95 may otherwise be reflected at an interface between the second electrode 100 and a protection layer (not illustrated) toward non-luminescent regions.

In some embodiments, when one pixel opening 90 is formed through the pixel defining layer 85, one light emitting structure 95 may be formed on the first electrode 70 and one reflecting structure (not illustrated) may be formed at the second electrode 100. In some embodiments, a plurality of pixel openings 90 may be formed through the pixel defining layer 85, and thus a plurality of light emitting structures 95 may be formed in the pixel openings 90. A plurality of reflecting structures (not illustrated) respectively surrounding the plurality of light emitting structures 95 may be formed at the second electrode 100. Alternatively, one reflecting structure (not illustrated) entirely surrounding the plurality of light emitting structures 95 may be formed at the second electrode 100.

Although it is not illustrated, the organic light emitting display device, which has a construction substantially the same as or substantially similar to that of the organic light emitting display device described with reference to FIG. 1, may be manufactured by forming a protection layer and a second substrate on the second electrode 100. In this case, the protection layer may extend from the luminescent region to the non-luminescent region. The protection layer may be formed using an organic material and/or an inorganic material. For example, the protection layer may include photoresist, polyamide-based polymer, polyimide-based polymer, acryl-based polymer, siloxane-based polymer, polymer containing photosensitive acryl carboxyl, novolak resin, alkali developable resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and/or titanium oxide, etc. These may be used alone or in various combinations thereof. Further, the protection layer may be obtained by a spin coating process, a printing process, a sputtering process, a CVD process, an ALD process, a PECVD process, an HDP-CVD process, or a vacuum evaporation process, etc.

The second substrate may include a transparent insulation substrate such as a glass substrate, a transparent plastic substrate, and/or a transparent ceramic substrate, etc. In some embodiments, a space may be provided between the protection layer and the second substrate or between the protection layer and the second electrode 100, in the luminescent region. In this case, the space may be filled with air and/or an inert gas such as a nitrogen gas. Alternatively, the space may be filled with resin having light transmittance and hygroscopicity.

Figure 8:
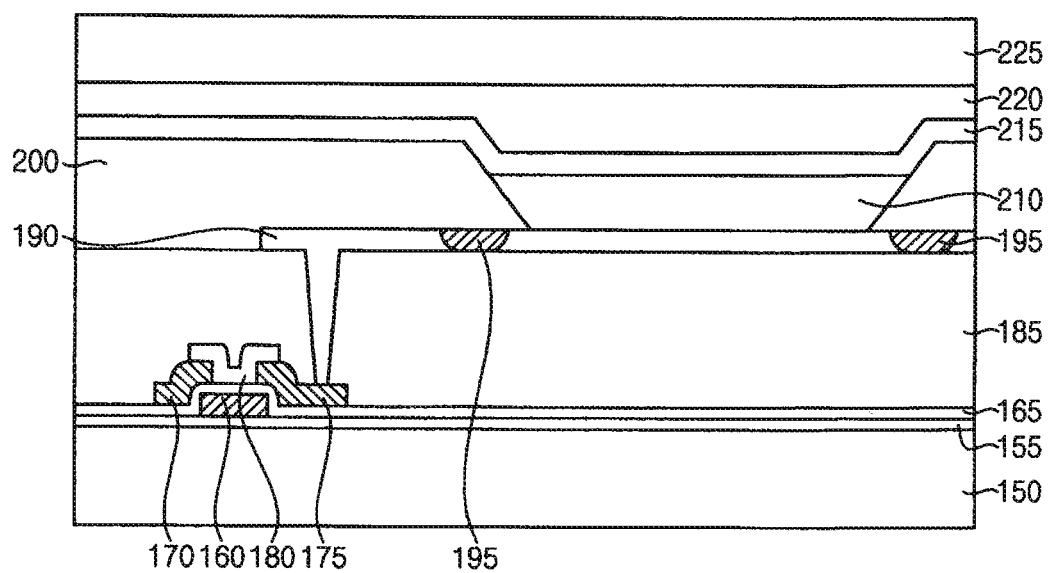

FIG. 8 is a cross-sectional view illustrating an organic light emitting display device in accordance with another exemplary embodiment of the present invention.

Referring to FIG. 8, the organic light emitting display device may include a first substrate 150, a switching device on the first substrate 150, an insulation layer 185 covering the switching device, a first electrode 190 disposed on the insulation layer 185, a reflecting structure 195 at or in the first electrode 190, a pixel defining layer 200 on the first electrode 190 and the insulation layer 185, a light emitting structure 210 positioned on a portion of the first electrode 190, a second electrode 215 on the light emitting structure 210 and the pixel defining layer 200, a protection layer 220 on the second electrode 215, and a second substrate 225 on the protection layer 220. In some embodiments, at least one reflecting structure 195 may be at or in the second electrode 215 of the organic light emitting display device.

The first substrate 150 may include a transparent conductive material. A buffer layer 155 may be selectively provided on the first substrate 150. In some embodiments, the switching device may include an oxide semiconductor device. In this case, the oxide semiconductor device may include a gate electrode 160, a gate insulation layer 165, a source electrode 170, a drain electrode 175, an active pattern 180, etc.

The gate electrode 160 may include metal, alloy, metal nitride, conductive metal oxide, and/or a transparent conductive material, etc. The gate insulation layer 165 may be on the buffer layer 155 to cover the gate electrode 160. The gate insulation layer 165 may include silicon oxide and/or metal oxide, and may have stepped portions caused by the gate electrode 160. The source and drain electrodes 170 and 175 may be spaced apart from each other on the gate insulation layer 165 by a predetermined distance. For example, the source and drain electrodes 170 and 175 may be positioned over the gate electrode 160 to partially expose the gate insulation layer 165. Each of the source and drain electrodes 170 and 175 may include metal, alloy, metal nitride, conductive metal oxide, and/or a transparent conductive material, etc.

The active pattern 180 may be positioned on the portion of the gate insulation layer 165 exposed by the source and drain electrodes 170 and 175. The active pattern 180 may extend on the source and drain electrodes 170 and 175. In some embodiments, the active pattern 180 may include a semiconductor oxide. For example, the active pattern 180 may include indium-gallium-zinc oxide (IGZO), gallium zinc oxide (GaZnxOy), indium tin oxide (ITO), indium zinc oxide (IZO), zinc magnesium oxide (ZnMgxOy), zinc tin oxide (ZnSnxOy), zinc zirconium oxide (ZnZrxOy), zinc oxide (ZnOx), gallium oxide (GaOx), tin oxide (SnOx), titanium oxide (TiOx), indium oxide (InOx), indium-gallium-hafnium oxide (IGHO), tin-aluminum-zinc oxide (TAZO), and/or indium-gallium-tin oxide (IGSO), etc. These may be used alone or in various combinations thereof. The insulation layer 185 may be arranged on the gate insulation layer 165 to sufficiently cover the switching device. The insulation layer 185 may include an organic material and/or an inorganic material and may have a substantially level upper face.

The first electrode 190 may be electrically connected to the switching device and may be arranged on the insulation layer 185. The first electrode 190 may pass through the insulation layer 185 to make contact with the drain electrode 175 of the switching device. As described above, the first electrode 190 may include a transparent conductive material or a material having reflectivity in accordance with an emission type of the organic light emitting display device. When the first electrode 190 includes a transparent conductive material, the reflecting structure 195 may include a material having reflectivity.

When the first electrode 190 includes a transparent conductive material, at least one reflecting structure 195 may be disposed at or in the first electrode 190 adjacent to a luminescent region. Alternatively, when the second electrode 215 includes a transparent conductive material, at least one reflecting structure 195 may be positioned at or in the second electrode 215 around the luminescent region. For example, at least one reflecting structure 195 may be arranged at or in one of the first electrode 190 or the second electrode 215 to substantially surround at least one light emitting structure 210. Additionally, at least one reflecting structure 195 may be fully buried in one of the first electrode 190 or the second electrode 215, or may protrude from one of the first electrode 190 or the second electrode 215.

In some embodiments, the reflecting structure 195 may have across-sectional shape substantially rounded toward the first substrate 150, such as a substantially half circular shape, a substantially half elliptical shape, a substantially half track-shaped shape, etc. Thus, a sidewall of the reflecting structure 195 may have an angle of inclination in a range of about +20° to about +70° or in a range of about −20° to about −70° relative to a direction substantially parallel to the first substrate 150. In this case, a planar shape of the reflecting structure 195 may be substantially the same as or substantially similar to that of the reflecting structure 80 described with reference to FIG. 1.

The pixel defining layer 200 may be on the first electrode 190, the reflecting structure 195 and the insulation layer 185. The pixel defining layer 200 may partially expose the first electrode 190. The pixel defining layer 200 may define a luminescent region and a non-luminescent region of the organic light emitting display device. Here, the reflecting structure 195 may be positioned between the luminescent region and the non-luminescent region. The pixel defining layer 200 may include an organic material and/or an inorganic material, and may have a pixel opening that partially exposes the first electrode 190 to define the luminescent region. Here, a sidewall of the pixel opening of the pixel defining layer 200 may have an angle of inclination in a range of about 110° to about 160° with respect to an axis substantially parallel to the first substrate 150.

The light emitting structure 210 may be positioned on a portion of the first electrode 190 exposed by the pixel defining layer 200. The light emitting structure 210 may have an organic light emitting layer, a hole injection layer, a hole transport layer, an electron transport layer, and/or an electron injection layer, etc. In some embodiments, at least one light emitting structure 210 may be on the first elect ode 190. Here, at least one reflecting structure 195 substantially surrounding the light emitting structure 210 may be at or in the first electrode 190 or the second electrode 215.

The second electrode 215 may be on the light emitting structure 210 and the pixel defining layer 200. The second electrode 215 may include a material having reflectivity or a transparent conductive material in accordance with an emission type of the organic light emitting display device. At least one reflecting structure 195 may be partially or fully buried in the second electrode 215 according to the material of the second electrode 215.

The protection layer 220 may be on the second electrode 215. The protection layer 220 may be arranged on the second electrode 215 to provide a space over the light emitting structure 210. The protection layer 220 may include an organic material and/or an inorganic material. The space between the protection layer 220 and the second electrode 215 may be filled with air, an inert gas and/or a moisture absorbing resin. The second substrate 225 may be provided on the protection layer 220. The second substrate 225 may include a material substantially the same as or substantially similar to materials of the first substrate 150, or may include a material different from materials of the first substrate 150.

Figure 9:
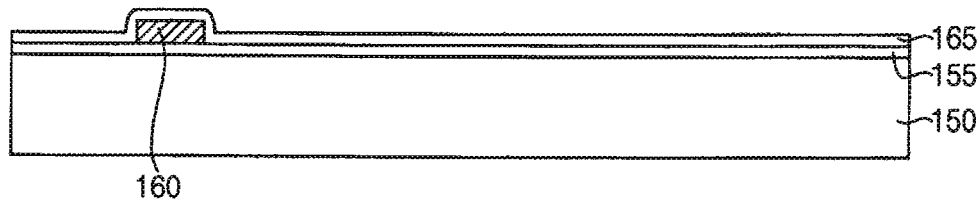
Figure 10:
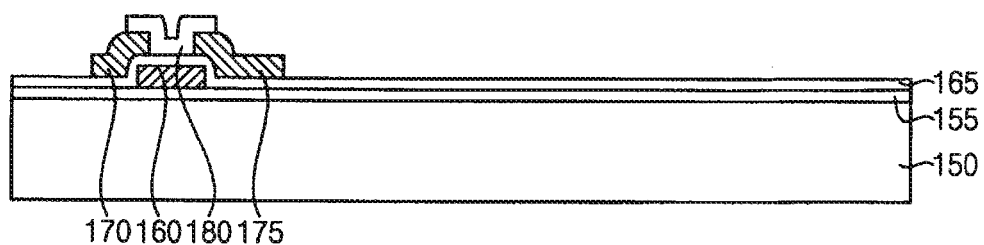
Figure 11:
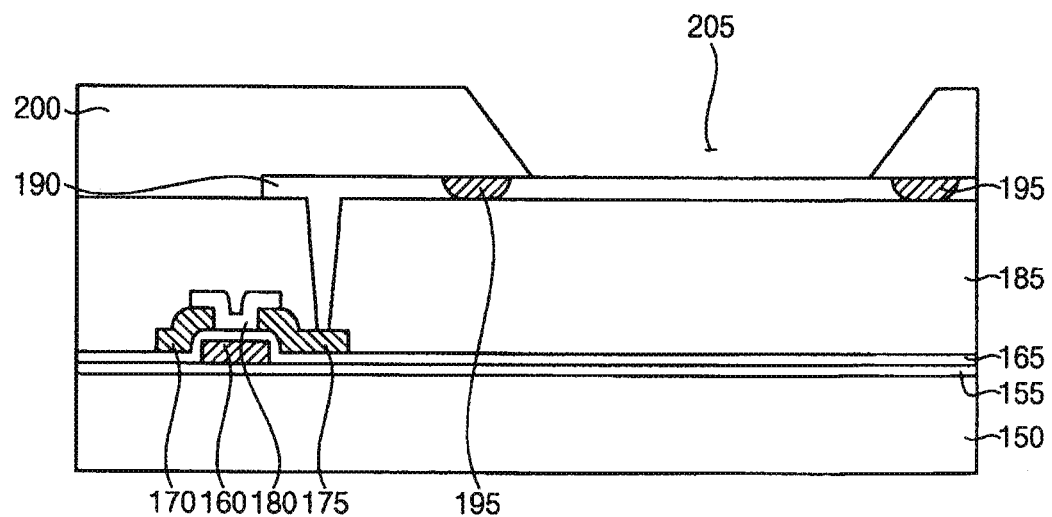

FIGS. 9 to 11 are cross-sectional views illustrating a method of manufacturing an organic light emitting display device in accordance with another embodiment of the present invention. The organic light emitting display device manufactured by the method illustrated in FIGS. 9 to 11 may have a construction substantially the same as or substantially similar to that of the organic light emitting display device described with reference to FIG. 8.

Referring to FIG. 9, after selectively forming a buffer layer 155 on a first substrate 150, a gate electrode 160 may be formed on the buffer layer 155 or the first substrate 150. When the buffer layer 155 is provided on the first electrode 150, the buffer layer 155 may be formed using a silicon compound by a CVD process, a PECVD process, a spin coating process, or a HDP-CVD process, etc.

The gate electrode 160 may be formed using metal, alloy, metal compound, conductive metal oxide, and/or a transparent conductive material, etc. A gate line (not illustrated) electrically connected to the gate electrode 160 may be formed on a portion of the buffer layer 155 or the first substrate 150. The gate electrode 160 and the gate line may be formed by partially etching the first conductive layer after forming a first conductive layer (not illustrated) on the buffer layer 155 or the first substrate 150.

A gate insulation layer 165 may be formed on the first substrate 150 or the buffer layer 155 to cover the gate electrode 160. The gate insulation layer 165 may be formed by depositing silicon oxide and/or metal oxide on the first substrate 150 or the buffer layer 155 through a sputtering process, a CVD process, a printing process, a PECVD process, a spin coating process, an HDP-CVD process, a vacuum evaporation process, or a thermal oxidation process, etc. The gate insulation layer 165 may be formed along a profile of the gate electrode 160. Alternatively, the gate insulation layer 165 may have a substantially flat upper face to sufficiently cover the gate electrode 160. For example, the upper face of the gate insulation layer 165 may be substantially planarized by a CMP process and/or an etch-back process.

Referring to FIG. 10, a source electrode 170 and a drain electrode 175 may be formed on the gate insulation layer 165. Each of the source and drain electrodes 170 and 175 may be formed using metal, alloy, metal nitride, conductive metal oxide, and/or a transparent conductive material, etc. In this case, a data line (not illustrated) electrically connected to the source electrode 170 may be provided on a portion of the gate insulation layer 165. The data line may extend along a direction substantially perpendicular to a direction in which the gate line extends. In some embodiments, after forming a second conductive layer (not illustrated) on the gate insulation layer 165, the data line and the source and drain electrodes 170 and 175 may be formed by partially etching the second conductive layer. For example, the second conductive layer may be formed by a sputtering process, a vacuum evaporation process, a printing process, a CVD process, or an ALD process, etc.

The source and drain electrodes 170 and 175 may be separated from each other, and may be substantially centering or surrounding the underlying gate electrode 160. When the source and the drain electrodes 170 and 175 are formed, a portion of the gate insulation layer 165 under which the gate electrode 160 is located may be exposed.

An active pattern 180 may be formed on the exposed gate insulation layer 165, the source electrode 170 and the drain electrode 175. The active pattern 180 may be formed using a semiconductor oxide. For example, the active pattern 180 may be formed using indium-gallium-zinc oxide, gallium zinc oxide, indium tin oxide, indium zinc oxide, zinc magnesium oxide, zinc tin oxide, zinc zirconium oxide, zinc oxide, gallium oxide, tin oxide, titanium oxide, indium oxide, indium-gallium-hafnium oxide, tin-aluminum-zinc oxide, and/or indium-gallium-tin oxide, etc. These may be used alone or in various combinations thereof. In some embodiments, after forming an active layer (not illustrated) on the source and drain electrodes 170 and 175 and the gate insulation layer 165, the active pattern 180 may be obtained by patterning the active layer. For example, the active layer may be formed by a sputtering process, a CVD process, a printing process, a spray process, a vacuum evaporation process, an ALD process, a sol-gel process, or a PECVD process, etc.

As illustrated in FIG. 10, when the active pattern 180 is formed, an oxide semiconductor device including the gate electrode 160, the gate insulation layer 165, the source electrode 170, the drain electrode 175, and the active pattern 180 may be provided on the first substrate 150 as a switching device of the organic light emitting display device.

Referring to FIG. 11, an insulation layer 185 may be formed on the gate insulation layer 165 to cover the active pattern 180, the source electrode 170, and the drain electrode 175. The insulation layer 185 may have a substantially level upper face completely covering the active pattern 180. The insulation layer 185 may be formed by depositing an organic material and/or an inorganic material on the gate insulation layer 165 by a sputtering process, a CVD process, a printing process, a PECVD process, a spin coating process, a HDP-CVD process, or a vacuum evaporation process, etc.

In some embodiments, after forming a hole that exposes a portion of the drain electrode 175 by partially etching the insulation layer 185, a first electrode 190 may be formed on the insulation layer 185 to fill the hole of the insulation layer 185. The first electrode 190 may be formed by depositing a transparent conductive material or a material having reflectivity on the insulation layer 185 through a sputtering process, a CVD process, an ALD process, a vacuum evaporation process, or a printing process, a PLO process, etc.

As illustrated in FIG. 11, an opening, a trench, a recess, a groove, a dent, or other similar structure may be formed at or in the first electrode 190 by partially etching the first electrode 190. The opening, the trench, the recess, the groove, the dent, or other similar structure may be obtained by a wet etching process. Here, the opening or the trench of the first electrode 190 may partially expose the insulation layer 185, whereas a recess, a groove, or a dent may not expose the insulation layer 185. In some embodiments, the opening of the first electrode 190 may have a cross-sectional shape substantially rounded toward the first substrate 150. For example, the opening of the first electrode 190 may have various cross-sectional shapes such as a substantially half circular shape, a substantially half elliptical shape, a substantially half track-shaped shape, etc. For example, a sidewall of the first electrode 190 may have an angle of inclination in a range of about +20° to about +70° or in a range of about −20° to about −70° with respect to a direction substantially parallel to the first substrate 150. In this case, the opening of the first electrode 190 may have a planar shape substantially the same as or substantially similar to that of the opening 75 of the first electrode 70 described with reference to FIG. 5.

A reflecting structure 195 may be formed in the opening of the first electrode 190. The reflecting structure 195 may be formed by depositing a material having reflectivity in the opening through a sputtering process, a CVD process, an ALD process, a vacuum evaporation process, a printing process, or a PLD process, etc. In some embodiments, when the first electrode 190 includes a transparent conductive material, at least one opening may be formed through the first electrode 190, and at least one reflecting structure 195 may be formed in the at least one opening.

A pixel defining layer 200 may be formed on the insulation layer 185, the first electrode 190 and the reflecting structure 195. The pixel defining layer 200 may be formed using an organic material and/or an inorganic material. The pixel defining layer 200 may define a luminescent region and a non-luminescent region of the organic light emitting display device. At least one pixel opening 205 may be formed in the pixel defining layer 200 to expose the first electrode 190 in the luminescent region. Here, the pixel opening 205 of the pixel defining layer 200 may include a sidewall having a predetermined angle of inclination relative to a direction substantially parallel to the first substrate 150.

Although it is not illustrated, after forming a light emitting structure on the exposed first electrode 190, a second electrode, a protection layer and a second substrate may be sequentially formed on the light emitting structure, so that an organic light emitting display device, which has a construction substantially the same as or substantially similar to that of the organic light emitting display device described with reference to FIG. 8, may be manufactured. Here, the second electrode, the protection layer and the second substrate may be formed by using materials substantially the same as or substantially similar to those described with reference to FIG. 7 and by processes substantially the same as or substantially similar to those described with reference to FIG. 7.

In some embodiments, a plurality of pixel openings 205 may be formed in the pixel defining layer 200, and a plurality of light emitting structures (not illustrated) may be formed in the plurality of pixel openings 205, respectively. In this case, a plurality of reflecting structures respectively surrounding the plurality of light emitting structures may be formed in the first or second electrode. In some example embodiments, one reflecting structure entirely enclosing the plurality of light emitting structures may be formed in the first or second electrode.

According to exemplary embodiments of the present invention, an organic light emitting display device may include at least one reflecting structure substantially surrounding at least one light emitting structure at or in a first electrode or a second electrode, so that light efficiency and luminance of the organic light emitting display device may be enhanced or improved in comparison to conventional organic light emitting display devices. Therefore, quality of a displayed image may be improved.

The foregoing is illustrative of exemplary embodiments of the present invention, and is not to be construed as limiting thereof. Although a few exemplary embodiments have been described, those skilled in the art will readily appreciate that many modifications are possible within the exemplary embodiments, without materially departing from the novel teachings and advantages of these embodiments. Accordingly, all such modifications are intended to be included within the scope of the invention as defined in the claims. Therefore, it is to be understood that the foregoing is illustrative of various exemplary embodiments, and is not to be construed as limited to the specific embodiments disclosed, and that modifications to the disclosed embodiments, as well as other embodiments, are intended to be included within the scope of the appended claims.

What is claimed is:

1. An organic light emitting display device comprising:
   a substrate having a luminescent region and a non-luminescent region;
   an insulation layer on the substrate;
   a first electrode on the insulation layer;
   at least one light emitting structure on the first electrode;
   a second electrode on the light emitting structure; and
   at least one reflecting structure buried in one of the first electrode or the second electrode around the at least one light emitting structure.

2. The organic light emitting display device of claim 1, wherein the reflecting structure includes a material having reflectivity.

3. The organic light emitting display device of claim 2, wherein the reflecting structure is configured to reflect light generated from the light emitting structure and reflected at an interface between the first electrode and the insulation layer toward the non-luminescent region back toward the luminescent region.

4. The organic light emitting display device of claim 2, wherein the reflecting structure comprises at least one material selected from the group consisting of silver (Ag), platinum (Pt), chrome (Cr), tungsten (W), molybdenum (Mo), titanium (Ti), palladium (Pd), iridium (Ir), and alloys thereof.

5. The organic light emitting display device of claim 1, wherein the reflecting structure has one of a circular ring shape, an elliptical ring shape, a track-shaped ring shape, or a polygonal ring shape.

6. The organic light emitting display device of claim 1, wherein a cross-sectional shape of the reflecting structure is one of a truncated inverted-trapezoid shape, a truncated inverted-wedge shape, or a rounded shape directed toward the substrate.

7. The organic light emitting display device of claim 1, wherein a sidewall of the reflecting structure has an angle of inclination in a range of about +20' to about +70° or in a range of about −20° to about −70° with respect to a direction parallel to the substrate.

8. The organic light emitting display device of claim 1, wherein a plurality of light emitting structures are on the first electrode, and wherein a plurality of reflecting structures corresponding to the plurality of light emitting structures are at the one of the first electrode or the second electrode.

9. The organic light emitting display device of claim 1, wherein a plurality of light emitting structures are on the first electrode, and wherein at least one reflecting structure surrounding the plurality of light emitting structures is at the one of the first electrode or the second electrode.

10. The organic light emitting display device of claim 1, wherein the reflecting structure protrudes from the one of the first electrode or the second electrode.

11. The organic light emitting display device of claim 1, further comprising a switching device between the substrate and the insulation layer, the switching device electrically connected to the first electrode.

12. The organic light emitting display device of claim 1, wherein the first electrode comprises a transparent conductive material and the second electrode comprises a material having reflectivity, and wherein the reflecting structure is at the first electrode.

13. The organic light emitting display device of claim 12, wherein the reflecting structure and the second electrode comprise a same material.

14. The organic light emitting display device of claim 1, wherein the first electrode comprises a material having reflectivity and the second electrode comprises a transparent conductive material, and wherein the reflecting structure is at the second electrode.

15. The organic light emitting display device of claim 14, wherein the reflecting structure and the first electrode comprise a same material.

16. The organic light emitting display device of claim 1, further comprising a protection layer on the second electrode, wherein the reflecting structure is configured to reflect light generated from the light emitting structure and reflected at an interface between the second electrode and the protection layer toward the non-luminescent region back toward the luminescent region.

17. A method of manufacturing an organic light emitting display device, comprising:

forming an insulation layer on a substrate;

forming a first electrode on the insulation layer;

forming at least one reflecting structure at the first electrode;

forming a pixel defining layer on the first electrode, the pixel defining layer defining a luminescent region and a non-luminescent region;

forming at least one light emitting structure on the first electrode in the luminescent region, the at least one light emitting structure being surrounded by the at least one reflecting structure; and forming a second electrode on the at least one light emitting structure and the pixel defining layer;

wherein forming the reflecting structure comprises partially etching the first electrode adjacent to an area between the luminescent region and the non-luminescent region, and forming the reflecting structure at the etched portion of the first electrode.

18. The method of claim 17, wherein partially etching the first electrode comprises forming at least one opening that exposes the insulation layer.

19. The method of claim 18, wherein the opening has one of a circular ring shape, an elliptical ring shape, a track-shaped ring shape, or a polygonal ring shape, and wherein a cross-sectional shape of the opening is one of a truncated inverted-trapezoid shape, a truncated inverted-wedge shape, or a rounded shape directed toward the substrate.

20. The method of claim 19, wherein a sidewall of the opening has an angle of inclination in a range of about +20° to about +70° or in a range of about −20° to about −70° with respect to a direction parallel to the substrate.

21. The method of claim 17, wherein a plurality of light emitting structures are formed on the first electrode, and wherein one reflecting structure surrounding the plurality of light emitting structures is formed at the first electrode.

22. The method of claim 17, wherein a plurality of light emitting structures are formed on the first electrode, and wherein a plurality of reflecting structures are formed at the first electrode, the plurality of reflecting structures respectively surrounding the plurality of light emitting structures.

23. A method of manufacturing an organic light emitting display device, comprising:

forming an insulation layer on a substrate;

forming a first electrode on the insulation layer;

forming a pixel defining layer on the first electrode, the pixel defining layer defining a luminescent region and a non-luminescent region;

forming at least one light emitting structure on the first electrode in the luminescent region;

forming a second electrode on the at least one light emitting structure and the pixel defining layer; and forming at least one reflecting structure at the second electrode, the reflecting structure surrounding the at least one light emitting structure;

wherein forming the reflecting structure comprises forming at least one opening through the second electrode adjacent to an area between the luminescent region and the non-luminescent region, and forming the reflecting structure in the at least one ginning.

* * * * *